United States Patent
Udagawa

(10) Patent No.: US 6,831,293 B2
(45) Date of Patent: *Dec. 14, 2004

(54) P-N JUNCTION-TYPE COMPOUND SEMICONDUCTOR LIGHT-EMITTING DEVICE, PRODUCTION METHOD THEREOF, LAMP AND LIGHT SOURCE

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/389,904

(22) Filed: Mar. 18, 2003

(65) Prior Publication Data

US 2003/0178631 A1 Sep. 25, 2003

Related U.S. Application Data

(60) Provisional application No. 60/384,095, filed on May 31, 2002.

(30) Foreign Application Priority Data

Mar. 19, 2002 (JP) ..................................... P2002-075297

(51) Int. Cl.⁷ .......................... H01L 33/00; H01L 21/20
(52) U.S. Cl. ........................... 257/47; 257/94; 257/190; 257/201; 438/47; 372/43
(58) Field of Search ..................... 438/46–47, 93–94; 257/88–90, 94; 372/43–46

(56) References Cited

U.S. PATENT DOCUMENTS

| | | | | |
|---|---|---|---|---|
| 5,042,043 A | * | 8/1991 | Hatano et al. ................. | 372/45 |
| 6,069,021 A | * | 5/2000 | Terashima et al. ............ | 438/46 |
| 6,194,744 B1 | * | 2/2001 | Udagawa et al. ............. | 257/94 |
| 2003/0173573 A1 | * | 9/2003 | Udagawa ..................... | 257/88 |

FOREIGN PATENT DOCUMENTS

| | | | |
|---|---|---|---|
| JP | 06-283825 | 10/1994 | |
| JP | 08-293643 | 11/1996 | |
| JP | 11-017222 | 1/1999 | |
| JP | 2000-012896 | * 1/2000 | ............ H01L/33/00 |
| JP | 2000-058451 | * 2/2000 | ............ H01L/21/20 |
| JP | 2000-235956 | * 8/2000 | ......... H01L/21/205 |
| JP | 2000-349335 | * 12/2000 | ............ H01L/33/00 |
| JP | 2001-036196 | 2/2001 | |
| JP | 2001-053338 | * 2/2001 | ............ H01L/33/00 |
| JP | 2001-308381 | * 11/2001 | ............ H01L/33/00 |
| JP | 2002-009340 | * 1/2002 | ............ H01L/33/00 |

* cited by examiner

Primary Examiner—Anh Duy Mai
(74) Attorney, Agent, or Firm—Sughrue Mion, PLLC

(57) ABSTRACT

A p-n junction-type compound semiconductor light-emitting device having a substrate formed of a single crystal, a first barrier layer provided on the substrate and formed of a compound semiconductor of a first conduction type, a light-emitting layer provided on the first barrier layer and formed of an indium (In)-containing group III nitride semiconductor of a first or a second conduction type, and an evaporation-preventing layer provided on the light-emitting layer for preventing the evaporation of indium from the light-emitting layer. The evaporation-preventing layer is formed of an undoped boron phosphide (BP)-base semiconductor of a second conduction type. A method for producing the semiconductor-light emitting device is also disclosed.

13 Claims, 4 Drawing Sheets

P-N JUNCTION-TYPE COMPOUND SEMICONDUCTOR LIGHT-EMITTING DEVICE, PRODUCTION METHOD THEREOF, LAMP AND LIGHT SOURCE

CROSS-REFERENCE TO RELATED APPLICATIONS

This application claims benefit of Provisional Application 60/384,095, filed May 31, 2002, incorporated herein by reference, under 35 U.S.C. § 111(b) pursuant to 35 U.S.C. § 119(e) (1).

BACKGROUND OF THE INVENTION

1. Field of the Invention

The present invention relates to a p-n junction-type compound semiconductor light-emitting device using a group III nitride semiconductor layer containing indium as a light-emitting layer. Specifically, the present invention relates to a p-n junction-type compound semiconductor light-emitting device where an evaporation-preventing layer provided on the light-emitting layer in order to prevent the evaporation of indium from the light-emitting layer is composed of an indirect transition-type boron phosphide (BP)-base semiconductor of a first or a second conduction type.

2. Background Art

Group III nitride semiconductors containing indium, such as gallium indium nitride ($Ga_xIn_{1-x}N$: $0 \leq X \leq 1$) (indium-containing group III nitride semiconductor), have been heretofore used as a constituent material of a light-emitting layer for emitting short wavelength light such as blue light (see, JP-B-55-3834 (the term "JP-B" as used herein means an "examined Japanese patent publication")). In order to obtain high-intensity light emission, the light-emitting part usually assumes a double hetero (DH) structure consisting of a light-emitting layer and barrier layers (cladding layers) sandwiching the light-emitting layer. The cladding layer for a $Ga_xIn_{1-x}N$ ($0 \leq X \leq 1$) light-emitting layer is conventionally composed of a group III nitride semiconductor such as wurtzite crystal-structure aluminum gallium nitride ($Al_xGa_{1-x}N$: $0 \leq X \leq 1$) intentionally doped with an n-type or a p-type impurity (see, JP-A-6-283825 (the term "JP-A" as used herein means an "unexamined published Japanese patent application")).

However, in a high temperature environment, indium (In) in the $Ga_xIn_{1-x}N$ ($0 \leq X \leq 1$) layer evaporates significantly and the indium composition ($=1-X$) in the layer decreases. In conventional techniques, an "evaporation-preventing" layer for preventing the evaporation of indium is formed on the $Ga_xIn_{1-x}N$ ($0 \leq X \leq 1$) light-emitting layer, and a cladding layer such as gallium nitride (GaN) is then provided in a high temperature environment (see, JP-A8-293643). The "evaporation-preventing" layer was heretofore exclusively composed of a group III nitride semiconductor such as direct transition-type wurtzite crystal-structure aluminum gallium nitride ($Al_xGa_{1-x}N$: $0 \leq X \leq 1$) (see, JP-A-5-69236 and JP-A-8-293643).

A technique where a "diffusion-preventing" layer for preventing the impurity doped in the barrier layer from diffusing and penetrating into the light-emitting layer or "evaporation-preventing" layer is provided between the "evaporation-preventing" layer and the barrier layer is also disclosed (see, JP-A-6-283825, supra). In particular, the "diffusion-preventing" layer for preventing magnesium (Mg) from diffusing and penetrating inside the n-type $Ga_xIn_{1-x}N$ light-emitting layer from the Mg-doped p-type barrier layer is usually also composed of a group III nitride semiconductor such as direct transition-type aluminum gallium nitride ($Al_xGa_{1-x}N$: $0 \leq X \leq 1$) (see, (1) JP-A-6-283825 supra and (2) JP-A-2001-36196).

Problems in conventional techniques regarding the "evaporation-preventing" layer are attributable to the wurtzite crystal-structure aluminum gallium nitride ($Al_xGa_{1-x}N$: $0 \leq X \leq 1$) constituting the "evaporation-preventing" layer. The wurtzite-structure crystal has a peculiar non-degenerated valence band structure (see, Toshiaki Ikoma and Hideaki Ikoma, *Kagobutsu Handotai no Kiso Bussei Nyumon* (*Guide for Basic Physical Properties of Compound Semiconductor*), 1st ed., page 17, Baifukan (Sep. 10, 1991)) and is conduction cannot be readily formed. For obtaining a low-resistance p-type group III nitride semiconductor layer, the wurtzite-structure crystal must be subjected to a heat treatment so as to eliminate a hydrogen atom (proton) (see, JP-A-5-183189). When an "evaporation-preventing" layer to be disposed between a barrier layer and a light-emitting layer composed of an indium-containing group III nitride semiconductor cannot be readily constructed on the light-emitting layer from a low-resistance electrically conducting layer, for example, a light-emitting diode (LED) having a low forward voltage (so-called $V_f$) cannot be readily provided. In addition, a laser diode (LD) having a low threshold voltage (so-called $V_{th}$) cannot be readily provided.

In a direct transition-type semiconductor, the probability of radiative recombination which brings about light emission is by far higher than that in an indirect transition-type semiconductor (see, K. Seeger, *Semiconductor no Butsuri Gaku* (*Ge*) (*Physics of Semiconductor* (*Last Volume*))", 1st imp., page 507, Yoshioka Shoten (Jun. 25, 1991)). This is the reason why the light-emitting layer is preferentially composed of a direct transition-type semiconductor material. In conventional techniques, the "evaporation-preventing" layer is, however, also composed of a direct transition-type group III nitride semiconductor having a high probability of radiative recombination. In addition to light emission from the light-emitting layer composed of an indium-containing group III nitride semiconductor, light is therefore also generated from the "evaporation-preventing" layer itself. In other words, light emission of a single wavelength cannot be obtained, and this disturbs the fabrication of a light-emitting device having excellent monochromaticity.

In conventional techniques, a barrier layer provided above the "evaporation-preventing" layer is also composed of a group III nitride semiconductor intentionally doped with an impurity. For example, the barrier layer on the light-emitting layer is composed of a magnesium (Mg)-doped group III nitride semiconductor. Therefore, it has been heretofore necessary to provide a "diffusion-preventing" layer for preventing the penetration of impurity such as Mg from the barrier layer into the light-emitting layer. That is, a light-emitting device cannot be readily fabricated.

SUMMARY OF THE INVENTION

The present invention has been made to solve the above-described problems. Specifically, the above object of the present invention has been achieved by providing the following:

(1) a p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of a first or a second conduction type, and an evaporation-preventing layer provided on the light-emitting layer for preventing the evaporation of indium from the light-emitting layer, wherein the evaporation-preventing layer is composed of an undoped boron phosphide (BP)-base semiconductor of second conduction type;

(2) the p-n junction-type compound semiconductor light-emitting device as described in (1) above, wherein the evaporation-preventing layer almost lattice-matches with the light-emitting layer;

(3) the p-n junction-type compound semiconductor light-emitting device as described in (1) or (2) above, wherein the first barrier layer is composed of an undoped boron phosphide-base semiconductor where an impurity is not intentionally added;

(4) a p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of a first or a second conduction type, an evaporation-preventing layer provided on the light-emitting layer for preventing the evaporation of indium from the light-emitting layer, and a second barrier layer provided on the evaporation-preventing layer and composed of a compound semiconductor of a second conduction type, wherein the evaporation-preventing layer is composed of an undoped indirect transition-type boron phosphide (BP)-base semiconductor of a first or a second conduction type;

(5) the p-n junction-type compound semiconductor light-emitting device as described in (4) above, wherein the evaporation-preventing layer almost lattice-matches with the light-emitting layer;

(6) the p-n junction-type compound semiconductor light-emitting device as described in (4) or (5) above, wherein the first barrier layer is composed of an undoped boron phosphide-base semiconductor where an impurity is not intentionally added;

(7) the p-n junction-type compound semiconductor light-emitting device as described in any one of (4) to (6) above, wherein the second barrier layer is composed of an undoped boron phosphide-base semiconductor where an impurity is not intentionally added;

(8) a lamp fabricated using the p-n junction-type compound semiconductor light-emitting device described in any one of (1) to (7) above;

(9) a light source using the lamp described in (8) above;

(10) a method for producing a p-n junction-type compound semiconductor light-emitting device, which comprises forming a first barrier layer composed of a compound semiconductor of a first conduction type on a substrate composed of a single crystal, forming a light-emitting layer composed of an indium (In)-containing group III nitride semiconductor of a first or a second conduction type on the first barrier layer, and forming an evaporation-preventing layer on the light-emitting layer for preventing the evaporation of indium from the light-emitting layer, wherein the evaporation-preventing layer is composed of an undoped boron phosphide (BP)-base semiconductor of a second conduction type;

(11) the method for producing a p-n junction-type compound semiconductor light-emitting device as described in (10) above, wherein the first barrier layer, the light-emitting layer and the evaporation-preventing layer are formed by a metal organic chemical vapor deposition method (MOCVD method);

(12) a method for producing a p-n junction-type compound semiconductor light-emitting device, which comprises forming a first barrier layer composed of a compound semiconductor of a first conduction type on a substrate composed of a single crystal, forming a light-emitting layer composed of an indium (In)-containing group III nitride semiconductor of a first or a second conduction type on the first barrier layer, forming an evaporation-preventing layer on the light-emitting layer for preventing the evaporation of indium from the light-emitting layer, and forming a second barrier layer composed of a compound semiconductor of a second conduction type on the evaporation-preventing layer, wherein the evaporation-preventing layer is composed of an undoped indirect transition-type boron phosphide (BP)-base semiconductor of a first or a second conduction type; and

(13) the method for producing a p-n junction-type compound semiconductor light-emitting device as described in (12) above, wherein the first barrier layer, the light-emitting layer, the evaporation-preventing layer and the second barrier layer are formed by a metal organic chemical vapor deposition method (MOCVD method).

DETAILED DESCRIPTION OF THE INVENTION

Figure 1:
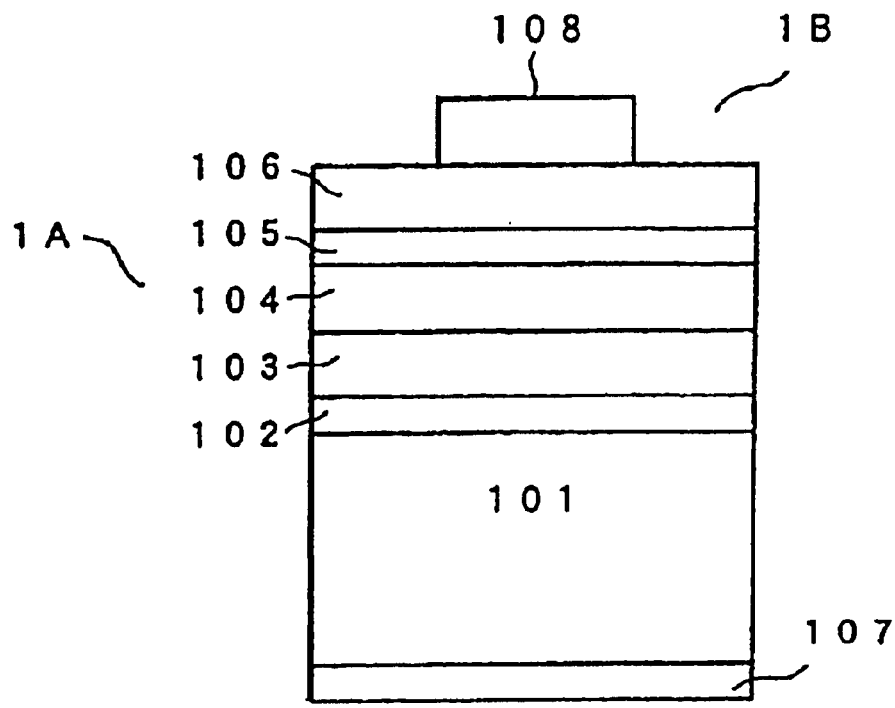
FIG. 1 is a cross-sectional view of an LED according to Example 3 of the present invention

The constitution of the p-n junction-type compound semiconductor light-emitting device according to the present invention is described by referring to an LED 1B shown in a schematic cross-sectional view of FIG. 1. In an epitaxial stacked layer structure 1A, a substrate 101 is formed using various kinds of crystals. For example, an n-type or a p-type electrically conducting group IV semiconductor single crystal such as silicon (Si) and silicon carbide (SiC), a group III–V compound semiconductor single crystal such as gallium phosphide (GaP) and gallium arsenide (GaAs), or a group III nitride semiconductor single crystal such as gallium nitride (GaN) and aluminum nitride (AlN) can be used as the substrate. An insulating α-alumina ($\alpha$-$Al_2O_3$) single crystal or a perovskite crystal-structure oxide single crystal can also be used as the substrate 101. The orientation of crystal plane forming the surface of the crystal constituting the substrate 101 is not particularly limited.

On the substrate 101, a first barrier layer 103 composed of a compound semiconductor of first conduction type having a cladding effect is provided on a light-emitting layer 104. In the case where the substrate 101 is an n-type or a p-type electrically conducting crystal, the conduction type of the first barrier layer 103 is preferably in agreement with the conduction type of the crystal constituting the substrate 101.

Furthermore, the first barrier layer 103 is composed of a compound semiconductor having a band gap larger than that of the light-emitting layer 104. In particular, a semiconductor material having a band gap larger by about 0.1 to 0.3 electron volt (eV) than that of a group III nitride semiconductor constituting the light-emitting layer 104 is preferred. For example, the first barrier layer 103 can be constituted from a group III nitride semiconductor such as n-type or p-type aluminum gallium indium nitride ($Al_A Ga_B In_C N$: $0 \leq A \leq 1$, $0 \leq B \leq 1$, $0 \leq C \leq 1$ and $A+B+C=1$) or from phosphide (BP)-base semiconductor containing boron (B) and phosphorus (P) as the constituent elements, such as $B_\alpha Al_\beta Ga_\gamma In_{1-\alpha-\beta-\gamma} P_{1-\delta} As_\delta$ ($0<\alpha \leq 1$, $0 \leq \beta <1$, $0 \leq \gamma <1$, $0<\alpha+\beta+\gamma \leq 1$ and $0 \leq \delta <1$) and $B_\alpha Al_\beta Ga_\gamma In_{1-\alpha-\beta-\gamma} P_{1-\delta} N_\delta$ ($0<\alpha \leq 1$, $0 \leq \beta <1$, $0 \leq \gamma <1$, $0<\alpha+\beta+\gamma \leq 1$ and $0 \leq \delta <1$).

From the boron phosphide-base semiconductor, a low-resistance electrically conducting layer can be obtained without intentionally adding (doping) of an impurity for controlling the conduction type. This is described below by referring to, as an example, boron monophosphide which is a typical boron phosphide-base semiconductor. In BP, either one of a phosphorus (P) atom occupying the boron (B) vacancy and acting as a donor component or a boron (B) atom occupying the phosphorus (P) vacancy and acting as an acceptor component can be selectively contained in a large amount even in the undoped state. For example, when the growth temperature is set to a high temperature exceeding about 1,000° C., a boron phosphide-base semiconductor layer preferentially containing a large number of acceptors relating to boron occupying the phosphorus vacancy can be formed. In other words, when a boron phosphide-base semiconductor layer is used, an electrically conducting first barrier layer having low resistance can be readily constructed without applying any cumbersome heat treatment (see, JP-A-5-183189). Moreover, an electrically conducting layer suitable for the construction of a barrier layer having a high carrier concentration exceeding about $10^{19}$ cm$^{-3}$ can be obtained without requiring any cumbersome doping using a different impurity depending on the conduction type of the layer. In the present invention, the first barrier layer is accordingly constructed preferably from an undoped boron phosphide-base semiconductor where an impurity is not intentionally added.

For example, when the first barrier layer 103 is provided on the crystal substrate 101 through an amorphous or polycrystalline buffer layer 102, a first barrier layer having good quality can be constructed (see, U.S. Pat. No. 6,069,021). The buffer layer 102 having the above-described crystal form relaxes the lattice mismatch between the crystal material of the substrate 101 and the first barrier layer 103 and provides a first barrier layer 103 having reduced misfit dislocation or the like and excellent crystallinity. When the first barrier layer is grown through the buffer layer 102, for example, a boron phosphide layer having a band gap larger than the band gap of 2 eV in conventional techniques (see, JP-A-2-275682) can be also formed. For example, according to a metal organic chemical vapor deposition method (MOCVD method), a boron monophosphide (BP) layer having a band gap of about 3 eV at room temperature can be formed on the buffer layer mainly comprising an amorphous and containing boron (B) and phosphorus (P). The boron phosphide layer having such a wide band gap is optically transparent, and by adjusting the layer thickness, the obtained first barrier layer 103 can serve also as an emitted light reflecting light layer reflecting light emitted from the light-emitting layer 104 to outside of the device.

On the first barrier layer 103, a light-emitting layer 104 is provided. The light-emitting layer 104 can be constructed from a group III nitride semiconductor containing indium (In) (indium-containing group III nitride semiconductor) and having a band gap suitable for the emission of near ultraviolet light or short wavelength visible light, for example, gallium indium nitride ($Ga_X In_{1-X} N$: $0 \leq X \leq 1$) (see, JP-B-55-3834). Furthermore, a light-emitting layer 104 for emitting multicolor light can be constructed by superposing a plurality of group III nitride semiconductor layers having different light emission wavelengths. For example, the light-emitting layer of the multicolor light emission can be constructed by superposing $Ga_X In_{1-X} N$ ($0 \leq X \leq 1$) and gallium phosphide nitride ($GaP_{1-Y} N_Y$: $0 < Y \leq 1$) (see, *Appl. Phys. Lett.*, 60, pp. 2540–2542 (1992)). Usually, the number of constituent layers for constructing a light-emitting layer of the multicolor light emission is preferably about 3 at most, because the light emission having a desired color can be generally obtained by mixing three colors. The conduction type of each constituent layer must be assimilated to either a first or a second conduction type. When a light-emitting layer of second conduction type is joined to a first barrier layer of first conduction type, a light-emitting part having a p-n junction-type single hetero (SH) structure can be constructed.

The light-emitting layer 104 can also be constructed to have, for example, a single- or multi-quantum well (QW) structure using $Ga_X In_{1-X} N$ ($0 \leq X \leq 1$) as a well layer. In the light-emitting layer having a multi-quantum well (MQW) structure, the layer stacked on the first barrier layer 103 can be either a well layer or a barrier layer, thereby forming a MQW structure with one end being a well layer or barrier layer. The other end of the MQW structure, namely, the terminal end of the MQW structure, can also be constructed by either a well layer or a barrier layer. The well layers constituting the MQW are composed of indium-containing group III nitride semiconductor materials differing in band gap, but the conduction type of each of the well layers is in agreement. In the present invention, the barrier layer is preferably constructed of a semiconductor layer having the same condition type as the well layer, and having a band gap larger than that of the constituent layer of the light-emitting layer.

On the light-emitting layer 104 comprising an indium-containing group III nitride semiconductor layer, an "evaporation-preventing" layer 105 for preventing the evaporation of indium (In) is provided.

In a first embodiment of the present invention, the "evaporation-preventing" layer is composed of an n-type or a p-type boron phosphide-base semiconductor layer. For example, the "evaporation-preventing" layer can be composed of $B_\alpha Al_\beta Ga_\gamma In_{1-\alpha-\beta-\gamma} P_{1-\delta} As_\delta$ ($0<\alpha \leq 1$, $0 \leq \beta <1$, $0 \leq \gamma <1$, $0<\alpha+\beta+\gamma \leq 1$ and $0 \leq \delta <1$) or $B_\alpha Al_\beta Ga_\gamma In_{1-\alpha-\beta-\gamma} P_{1-\delta} N_\delta$ ($0<\alpha \leq 1$, $0 \leq \beta <1$, $0 \leq \gamma <1$, $0<\alpha+\beta+\gamma \leq 1$ and $0 \leq \delta <1$). As described above, a boron phosphide-base semiconductor layer of n-type or p-type having sufficiently high electrical conductivity can be constructed from undoped BP. Accordingly, the "evaporation-preventing" layer constructed from the boron phosphide-base semiconductor layer can inhibit indium (In) from escaping outside the layer while preventing a rise in forward voltage (so-called $V_f$) or a threshold voltage (so-called $V_{th}$), which occurs in the case of an "evaporation-preventing" layer composed of a conventional group III nitride semiconductor layer.

Particularly, a boron phosphide-base semiconductor layer of low-resistance p-type can be formed without adding (doping) of an element belonging to Group II of the periodic table as a p-type impurity or without further applying of heat treatment after the addition of a p-type impurity.

Accordingly, an "evaporation-preventing" layer 105 having p-type conduction can be advantageously constructed with ease from the boron phosphide-base semiconductor layer without requiring a cumbersome doping or heat treatment operation. Moreover, when the "evaporation-preventing" layer 105 is constructed from an undoped boron phosphide-base semiconductor layer, a doping impurity (dopant) which penetrates into the light-emitting layer 104 is not present, and deterioration in the crystallinity of the light emitting layer 104 due to incorporation of an impurity can be prevented, and also diffusion of an impurity diffusing from the "evaporation-preventing" layer forming an increased level in the light-emitting layer resulting in unsuitable change of the wavelength of light emission can be avoided.

Furthermore, when the "evaporation-preventing" layer 105 is composed of a boron phosphide-base semiconductor, particularly, an indirect transition-type boron phosphide-base semiconductor, a p-n junction-type compound semiconductor light-emitting device having excellent monochromaticity can be obtained. As compared with the direct transition-type semiconductor, the probability of radiative recombination which brings about light emission is extremely low in the indirect transition-type semiconductor (see, Iwao Teramoto, *Handotai Device Gairon* (*Introduction of Semiconductor Device*), 1st ed., pp. 111–112, Baifukan (Mar. 30, 1995)). Accordingly, when the "evaporation-preventing" layer 105 is an indirect transition-type boron phosphide-base semiconductor layer, light emission from the "evaporation-preventing" layer 105 can be made far smaller as compared with the intensity of normal light emission from the light-emitting layer 104. That is, for example, even when a p-n junction is formed by the n-type "evaporation-preventing" layer 105 and the p-type barrier layer 106 joined thereto, subsidiary light emission from the "evaporation-preventing" layer 105 can be suppressed, which enables the fabrication of a p-n junction-type compound semiconductor light-emitting device having excellent monochromaticity.

When the "evaporation-preventing" layer 105 is constructed from a boron phosphide-base semiconductor layer almost lattice-matching with the indium-containing group III nitride semiconductor constituting the light-emitting layer 104, the light-emitting layer 104 can be prevented from deformation due to mismatch in the crystal lattice spacing between the light-emitting layer 104 and the "evaporation-preventing" layer 105. The "almost lattice-matching" means having a lattice spacing almost in agreement with the spacing of crystal planes constituting the surface of the light-emitting layer 104 or the spacing of crystal planes intersecting the surface. Assuming that the lattice spacing of the boron phosphide-base semiconductor layer constituting the "evaporation-preventing" layer 105 is d for the spacing (=D) of crystal planes constituting the surface of the light-emitting layer 104 or the spacing of crystal planes intersecting with the surface, the degree of lattice mismatch (=η: %) can be determined according to the following relational expression (1):

$$\eta(\%) = \{|D-d|/D\} \times 100 \qquad \text{Relational Expression (1)}$$

When the degree of lattice mismatch (η) is 2% or less, a p-n junction-type compound semiconductor light-emitting device having stable light emission wavelength can be provided by suppressing the application of strain to the light-emitting layer 104. Therefore, as used herein, the phrase "almost lattice-matching" also means that the degree of lattice mismatch defined by the relational expression (1) is 2% or less.

In a second embodiment of the present invention, a preferred example is the case (η=about 0.2%) where the light-emitting layer 104 is composed of gallium indium nitride mixed crystal ($Ga_{0.90}In_{0.10}N$: a-axis lattice constant= 3.216 Å (=D)) having a wurtzite crystal-structure (0001) plane and the "evaporation-preventing" layer 105 is constructed from a {110} crystal plane (d=3.209 Å) of boron monophosphide (BP) having a lattice constant of 4.538 Å.

When a second barrier layer 106 is provided by joining it to the "evaporation-preventing" layer 105, the light-emitting layer 104 is sandwiched by the first barrier layer 103 and the second barrier layer 106 via the light-emitting layer 104, and a double hetero (DH) junction light-emitting part is provided. In a DH-structure light-emitting part, the conduction type of the "evaporation-preventing" layer 105 may be identical or opposite the conduction type of the light-emitting layer 104. That is, in the DH-structure light-emitting part, the "evaporation-preventing" layer 105 can have either a first conduction type or a second conduction type. The conduction type of the "evaporation-preventing" layer 105 preferably is in agreement with the conduction type of the indium-containing group III nitride semiconductor layer constituting the light-emitting layer 104. As described above, in the case of the boron phosphide-base semiconductor layer, an n-type or a p-type low-resistance electrically conducting layer can be provided even without doping. Accordingly, the boron phosphide-base semiconductor layer is a material advantageous particularly in providing a p-type "evaporation-preventing" layer 105. The carrier concentration of the boron phosphide-base semiconductor layer suitable for the construction of the "evaporation-preventing" layer 105 is from about $1 \times 10^{17}$ $cm^{-3}$ to $5 \times 10^{19}$ $cm^{-3}$. As the boron phosphide-base semiconductor layer constituting the "evaporation-preventing" layer 105 has a higher carrier concentration, the forward voltage ($V_f$) in LED or the threshold voltage ($V_{th}$) in LD can be further reduced.

Irrespective of the single or double hetero junction structure, the thickness of the "evaporation-preventing" layer 105 is, in general, from 10 to 250 nm. If the layer is a thin film of less than 10 nm, the evaporation of indium (In) from the light-emitting layer 104 cannot be sufficiently prevented, and the indium composition ratio of the group III nitride semiconductor layer constituting the light-emitting layer 104 decreases, whereby the band gap is widened, disadvantageously resulting in a shorter light emission than the desired wavelength. As the temperature at which the light-emitting layer 104 subjected to heat becomes higher, the thickness of the "evaporation-preventing" layer 105 increases. An excessively thick layer with a thickness exceeding 250 nm is, however, not preferred, because the strain applied to the light-emitting layer 104 increases due to a difference in the thermal expansion coefficient even if the "evaporation-preventing" layer 105 is constructed from a boron phosphide-base semiconductor layer having a relationship almost lattice-matching light-emitting layer 104. In usually, the light emission wavelength disadvantageously becomes longer than the desired wavelength. The wavelength of light emission from the light-emitting layer 104 can be measured by a general spectrometric method for luminescence.

The second barrier layer 106 is composed of a compound semiconductor of a second conduction type, which is opposite the conduction type of the first barrier layer 103. In particular, the second barrier layer is preferably composed of a boron phosphide-base semiconductor layer of a second conduction type. From the boron phosphide-base semiconductor, a low-resistance electrically conducting layer can be obtained without adding of an impurity to control the conduction type. Furthermore, the second barrier layer composed of an undoped boron phosphide-base semiconductor where an impurity is not intentionally added can avoid diffusion of an impurity from the second barrier layer to the light-emitting layer. For example, the second barrier layer 106 can be constructed from an n-type boron phosphide-base semiconductor layer in case the first barrier layer 103 is p-type. When the second barrier layer 106 is constructed from a boron phosphide-base semiconductor layer having the same composition and almost the same layer thickness as the first barrier layer 103, the quantity of lattice strain or heat strain applied to the light emitting 104 or the "evaporation-preventing" layer 105 sandwiched by these barrier layers 103 and 106 can be made almost equal. This is effective for preventing the fluctuation of light emission wavelength.

In a third embodiment of the present invention, a preferred example is where the first barrier layer 103 is constructed from a boron monophosphide (BP) layer of first conduction type and having a thickness giving a reflectance of about 50% to about 60% for blue band light and the second barrier layer 106 is constructed from a BP layer of a second conduction type and having the same thickness. The carrier concentration of the second barrier layer 106 is suitably on the order of $5 \times 10^{17}$ cm$^{-3}$ to $5 \times 10^{19}$ cm$^{-3}$. In the case where an ohmic electrode is provided on the second barrier layer 106, the thickness of the second barrier layer 106 is preferably about 100 nm or more in view of the alloy front depth. If the layer is a thick film having a thickness exceeding about 3,000 nm, flatness on the surface may be impaired and an electrode exerting good ohmic property cannot be stably formed.

The first barrier layer 103, the light-emitting layer 104, the "evaporation-preventing" layer 105 and the second barrier layer 106 all can be grown by a vapor phase growth method such as halide vapor phase epitaxial (VPE) method, hydride VPE method, MOCVD method or molecular beam epitaxial (MBE) method. The layers 103 to 106 need not be always grown by the same vapor phase growth method. When the same growth method is used, an epitaxial stacked layer structure having the layers 103 to 106 can, however, be readily constructed. For example, according to the MOCVD method, the second barrier layer 106 can be constructed at a temperature lower than the indium-containing group III nitride semiconductor layer constituting the light-emitting layer 104 and this suppresses evaporation of indium (In) from the light-emitting layer 104 in addition to the "evaporation-preventing" layer 105.

The light-emitting device according to the present invention can be fabricated, for example, by providing electrodes 107 and 108 on the epitaxial stacked layer structure having a DH-structure light-emitting part on an electrically conducting crystal substrate 101. For example, an n-type or a p-type ohmic back surface electrode 107 is provided on the back surface of the electrically conducting silicon single crystal, and an ohmic surface electrode 108 is provided on the second barrier layer 106. In the case of an n-type boron phosphide-base semiconductor layer, the ohmic electrode can be composed of a gold alloy film such as gold.germanium (Au.Ge), gold.indium (Au.In) and gold-tin (Au.Sn). In the case of a p-type boron phosphide-base semiconductor layer, the ohmic electrode can be composed of an alloy film such as gold-zinc (Au.Zn) and gold.beryllium (Au.Be). In order to obtain an ohmic surface electrode 108 having low contact resistance, a low-resistance contact layer having a high carrier concentration may be disposed on the second barrier layer 106.

Using such an LED having ohmic electrodes, a lamp can be fabricated.

Figure 2:
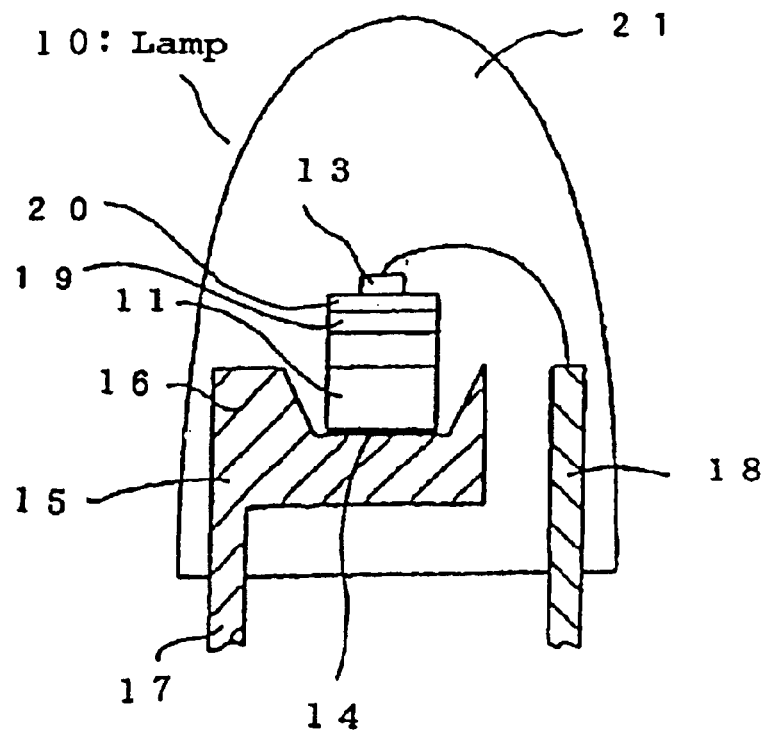
FIG. 2 is a schematic view of a lamp according to the present invention.
Figure 6:
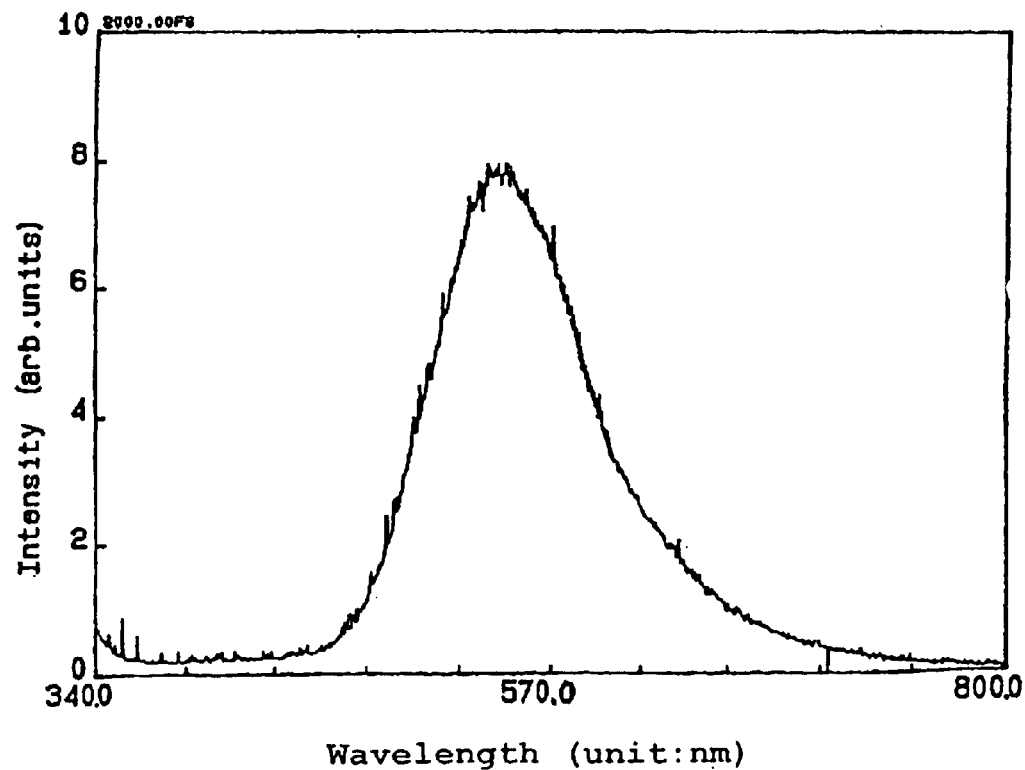
FIG. 6 is a light emission spectrum from a light-emitting layer having an "evaporation-preventing" layer.
Figure 7:
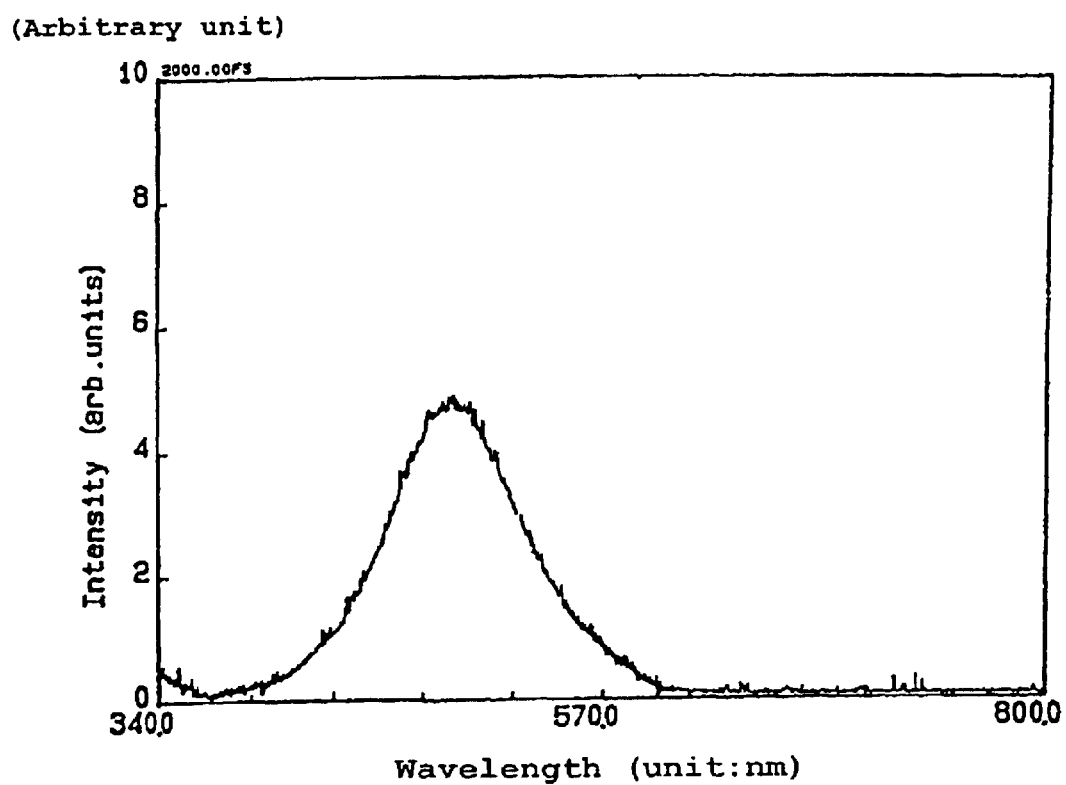
FIG. 7 is a light emission spectrum from a light-emitting layer having no "evaporation-preventing" layer.

In a fourth embodiment of the present invention as shown in FIG. 2, the LED is fixed to the center part of a metallic bowl 16 plated with a metal such as silver (Ag) or aluminum (Al) on a stem 15 using an electrically conducting bond material, whereby the back surface electrode 14 provided on the back surface of the electrically conducting substrate 11 used for fabricating the LED is electrically connected to one terminal 17 attached to the stem 15. The surface electrode 13 disposed, for example, on the second barrier layer 20 of the LED is also connected to another terminal 18 using a gold wire. The LED is then surrounded by a molding resin 21 such as epoxy resin and thereby a lamp 10 is fabricated. In the LED according to the present invention, the indium composition of the light-emitting layer is controlled based on the "evaporation-preventing" layer 19 composed of a boron phosphide-base semiconductor layer. As shown in FIG. 6, light emission having a predetermined wavelength of 547 nm can be therefore obtained from the Ga$_x$In$_{1-x}$N light-emitting layer for the emission of green band light. Incidentally when the "evaporation-preventing" layer is not provided on the light-emitting layer, the wavelength of light emission from the light-emitting layer becomes a short wavelength of 497 nm as shown in FIG. 7. Accordingly, a lamp 10 emitting light having a desired wavelength can be fabricated from an LED having the "evaporation-preventing" layer 19 according to the present invention.

When the LEDs or lamps according to the present invention are assembled, a light source can be fabricated. For example, a light source driving under constant voltage can be fabricated by electrically connecting a plurality of lamps in parallel. A light source driving under constant current can also be fabricated by electrically connecting lamps in series. In particular, an RGB-type multicolor light source can be fabricated by combining lamps of emitting light having different colors of red (R), green (G) and blue (B) (see, Japanese Patent Application No. 2001-248455). As compared with conventional incandescent fluorescent-type lamps, these light sources do not require much electric power on lighting, and are therefore useful particularly as a low power consumption-type light source having a long life time. For example, these light sources can be used as a light source for room lighting or as a light source for use in outdoor display or indirect lighting. The light source according to the present invention is fabricated from an LED or lamp where the light-emitting layer has a predetermined indium composition due to the activity of the "evaporation-preventing" layer composed of a boron phosphide-base semiconductor layer, so that a light source giving a desired light emission wavelength can be advantageously fabricated.

The "evaporation-preventing" layer constructed from an n-type or a p-type boron phosphide-base semiconductor layer prevents the evaporation of indium from the light-emitting layer comprising an indium-containing group III nitride semiconductor layer.

The "evaporation-preventing" layer comprising a boron phosphide-base semiconductor almost lattice-matching with the indium-containing group III nitride semiconductor constituting the light-emitting layer reduces the quantity of strain applied to the light-emitting layer in addition to the activity of preventing the evaporation of indium from the light-emitting layer composed of an indium-containing group III nitride semiconductor layer.

The second barrier layer constructed from an undoped boron phosphide-base semiconductor where an impurity is not added acts as a barrier layer capable of avoiding diffusion of an impurity into the light-emitting layer.

EXAMPLES

The present invention is described in more detail by referring to the figures. However, the present invention should not be limited thereto.

Example 1

The present invention is specifically described by referring to the case of fabricating a p-n junction-type LED having an "evaporation-preventing" layer composed of boron monophosphide.

Figure 3:
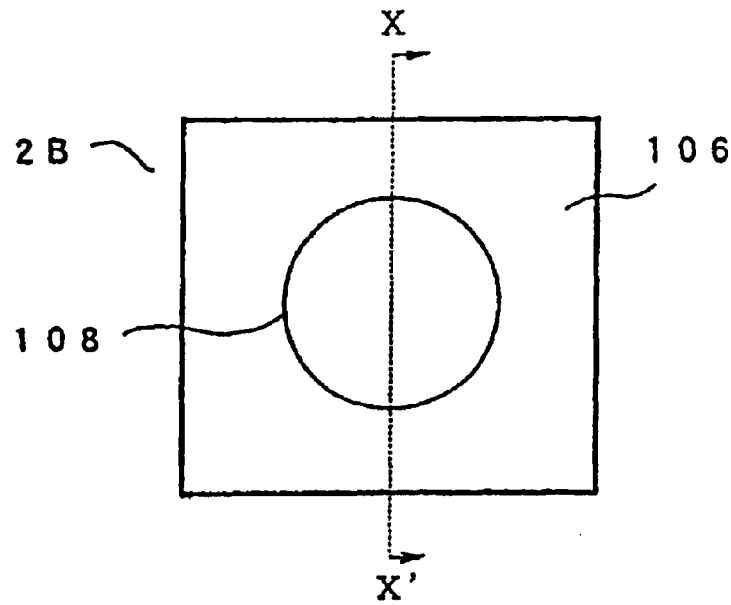
FIG. 3 is a schematic plan view of an LED according to Example 1 of the present invention.
Figure 4:
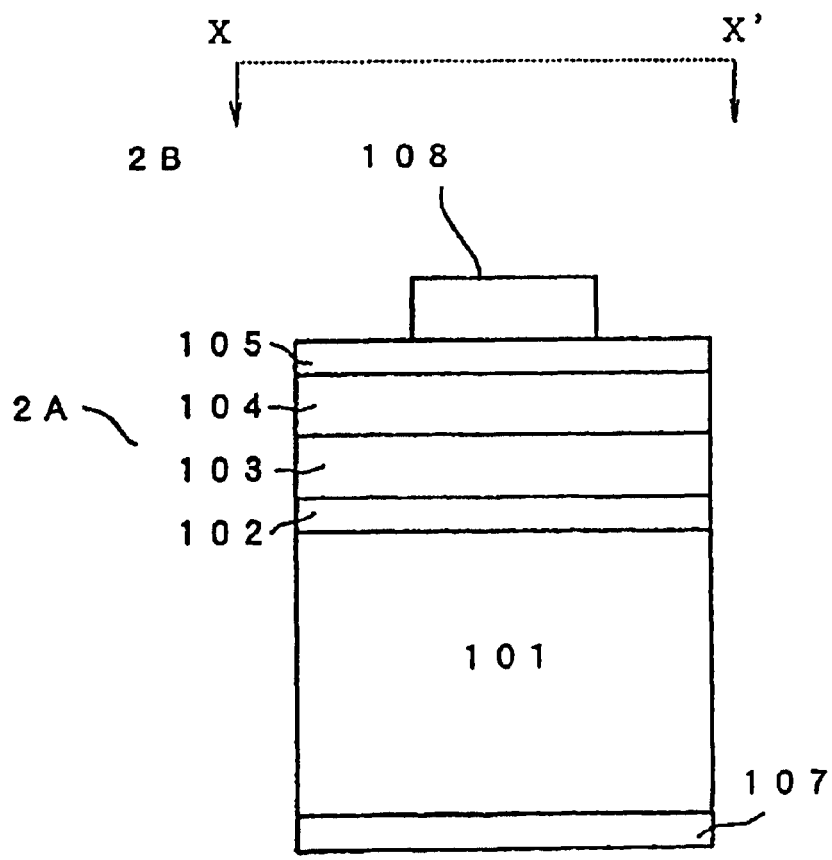
FIG. 4 is a schematic cross-sectional view cut along the broken line X–X' of the LED shown in FIG. 3.

FIG. 3 shows a schematic plan view of an LED 2B according to Example 1. FIG. 4 shows a schematic cross-sectional view cut along the broken line X–X' of FIG. 3. In the constituent elements of the LED 2B shown in FIGS. 3 and 4, the same constituent elements as those shown in FIG. 1 are indicated by the same reference numbers.

The stacked layer structure 2A for use in the LED 2B was formed using a boron (B)-doped p-type Si single crystal with the surface being a {111} crystal plane as a substrate 101. On the substrate 101, a buffer layer 102 composed of a boron phosphide mainly comprising an amorphous in the as-grown state was deposited at 450° C. by an atmospheric pressure triethylborane $(C_2H_5)_3B)$/phosphine $(PH_3)$/hydrogen $(H_2)$ MOCVD method. The thickness of the buffer layer 102 was 25 nm.

Figure 5:
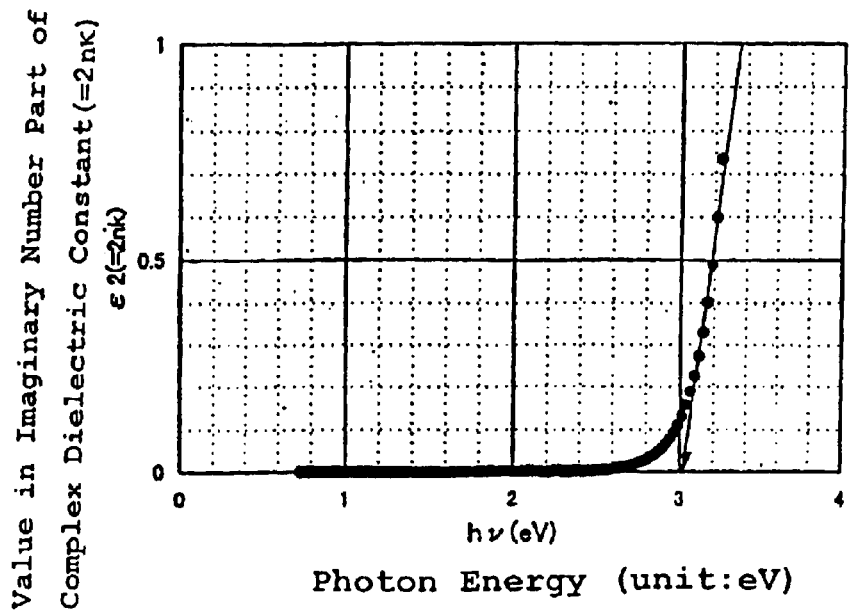
FIG. 5 is a graph of the wavelength energy dependency of the imaginary number part value of the complex dielectric constant of the BP layer.

After the completion of film formation of the buffer layer 102, the temperature of the substrate 101 was elevated to 1,050° C. After the temperature was elevated, a first barrier layer 103 comprising an undoped p-type boron phosphide (BP) layer and having a thickness of about 240 nm was stacked on the surface of the buffer layer 102 using the MOCVD vapor phase growth method. The band gap at room temperature of the boron monophosphide layer constituting the first barrier layer 103 was determined as about 3.0 eV from the photon energy distribution of the product (=2 n κ) of a refractive index (n) and an extinction coefficient (κ) shown in FIG. 5. The carrier concentration of the first barrier layer 103 measured by an ordinary electrolysis C-V (capacitance-reverse voltage) method was about $2 \times 10^{19}$ cm$^{-3}$. From the analysis of orientation by a general electron beam diffraction method, it was found that the surface of the BP layer constituting the first barrier layer 103 was constructed from {110} crystal planes.

After the completion of growth of the first barrier layer 103, the temperature of the silicon single crystal substrate 101 was lowered to 800° C. Thereafter, a light-emitting layer 104 composed of wurtzite crystal-structure n-type gallium indium nitride $(Ga_{0.70}In_{0.30}N)$ was stacked at 800° C. by an atmospheric pressure trimethylgallium $((CH_3)_3Ga)$/trimethylindium $((CH_3)_3In)$/ammonia $(NH_3)$/H$_2$ MOCVD method. At the film formation of the light-emitting layer 104, silicon (Si) was doped into the light-emitting layer 104 using a disilane $(Si_2H_6)$-hydrogen $(H_2)$ mixed gas. The amount of silicon doped into the light-emitting layer 104 was set such that the silicon atom concentration within the light-emitting layer 104 became about $5 \times 10^{18}$ cm$^{-3}$. The thickness of the light-emitting layer 104 was 50 nm. From the analysis by a general electron beam diffraction method, the surface of the light-emitting layer 104 was constructed from {0001} crystal planes.

On the surface of the light-emitting layer 104, an "evaporation-preventing" layer 105 composed of the n-type undoped boron monophosphide (BP) having the same conduction type (i.e., second conduction type) as the light-emitting layer 104 was joined to the light-emitting layer 104. The film formation of the "evaporation-preventing" layer 105 was performed at the same temperature of 800° C. as in the film formation of the light-emitting layer 104 by the above-described atmospheric pressure $(C_2H_5)_3B/PH_3/H_2$ MOCVD method. The thickness of the "evaporation-preventing" layer 105 was about 240 nm and the carrier concentration was about $7 \times 10^{18}$ cm$^{-3}$. The "evaporation-preventing" layer 105 was constructed from {110} crystal planes arrayed perpendicularly to the <1000> direction of {0001} crystal planes constituting the surface of the light-emitting layer 104 composed of $Ga_{0.70}In_{0.30}N$. Based on the Vegard's rule (see, *III–V Zoku Kagobutsu Handotai (Group III–V Compound Semiconductor)*, 1st ed., 1st imp., page 27, Corona Sha (Oct. 25, 1988)), the lattice spacing of {0001}-$Ga_{0.70}In_{0.30}N$ crystal planes, namely, the lattice constant of a-axis was determined as about 3.290 Å. On the other hand, the lattice spacing of {110} crystal planes of cubic zinc blende crystal-structure BP (lattice constant=4.538 Å) is about 3.208 Å. From these, the lattice mismatching degree (=η) between the light-emitting layer 104 and the "evaporation-preventing" layer 105 calculated according to the relational expression (1) was about 2.5%.

At the center part on the surface of the n-type "evaporation-preventing" layer 105, a surface electrode 108 having a three-layer structure of Au.Ge/nickel (Ni)/Au, where an ohmic electrode composed of gold.germanium (Au.Ge) alloy was disposed in contact with the "evaporation-preventing" layer 105. The surface electrode 108 serving also as a pad electrode for wire bonding was a circular electrode having a diameter of about 120 μm. Also, on almost the entire back surface of the p-type Si single crystal substrate 101, an ohmic electrode composed of aluminum.antimony (Al.Sb) alloy was disposed as a back surface back electrode 107 to fabricate an LED 2B. The thickness of the Al.Sb vacuum-deposited film was about 2 μm. After forming the surface electrode 108 and the back surface electrode 107, the Si single crystal constituting the substrate 101 was cut for fabricating an n side-up square LED 2B with one-side having a length of about 350 μm and penetrating the emitted light through the "evaporation-preventing" layer 105 to the outside.

When an operating current of 20 mA was passed in the forward direction between the back surface 107 and the surface electrode 108, blue light having a wavelength of about 450 nm was emitted from the LED 2 B. This light emission wavelength corresponded to about 2.7 eV as a band gap of $Ga_{0.70}In_{0.30}N$ (see, JP-B-55-3834) at room temperature. Thus, the "evaporation-preventing" layer 105 composed of an undoped BP according to the present invention prevented the light-emitting layer 104 from a reduction in the band gap due to evaporation of indium from the light-emitting layer 104. A subsidiary light emission of a wavelength other than 450 nm was not observed. The brightness in a chip state measured using a general integrating sphere was 6 millicandela (mcd). Thus, an LED 2B having high light emission intensity was provided. The forward voltage at the forward current of 20 mA was about 3 V and the reverse voltage at the reverse current of 10 μA was 5 V or more. As such, an LED 2B having good rectification characteristics was provided.

Example 2

In Example 2, the present invention is specifically described by referring to construction of the "evaporation-preventing" layer from a boron phosphide-base semiconductor layer different from Example 1.

In Example 2, the "evaporation-preventing" layer provided by joining it to the light-emitting layer comprising an n-type $Ga_{0.70}In_{0.30}N$ described in Example 1 was composed of an undoped n-type {110}-$B_\alpha In_{1-\alpha}P$ mixed crystal. The $B_\alpha In_{1-\alpha}P$ mixed crystal was grown at 800° C. by an atmospheric pressure $(CH_3)_3Ga/(CH_3)_3In/PH_3/H_2$ MOCVD method. The layer thickness was about 240 nm. The boron composition ratio (=α) of the $B_\alpha In_{1-\alpha}P$ mixed crystal constituting the "evaporation-preventing" layer was 0.91 (=91%) so that the lattice spacing of {110} crystal planes agreed with the a-axis lattice constant (=3.290 Å) of $Ga_{0.70}In_{0.30}N$. That is, in Example 2, the lattice mismatching degree η between the light-emitting layer and the "evaporation-preventing" layer was 0.

An LED was fabricated in the same manner as in Example 1 except that the "evaporation-preventing" layer was composed of a $B_{0.91}In_{0.09}P$ mixed crystal lattice-matching with the $Ga_{0.70}In_{0.30}N$ light-emitting layer. When an operating current of 20 mA was passed in the forward direction between the back surface electrode and surface electrode of this LED, blue light having a center wavelength of about 450 nm was emitted similarly to LED 2B of Example 1. The brightness of the LED in a chip state measured using a general integrating sphere was 8 mcd exceeding that of the LED in Example 1 and light emission with higher intensity was given. By virtue of good rectification characteristics, the forward voltage at the forward current of 20 mA was about 3 V and the reverse voltage at the reverse current of 10 μA was 8 V or more.

Example 3

In Example 3, the present invention is specifically described by referring to fabrication of an LED where a second barrier layer comprising a boron phosphide-base semiconductor layer of second conduction type is provided by joining it to the "evaporation-preventing" layer.

In Example 3, an LED having a cross-sectional structure shown in FIG. 1 was fabricated.

In the LED of Example 3, a second barrier layer 106 composed of an undoped n-type boron phosphide was provided by joining it to an "evaporation-preventing" layer 105 composed of a $B_\alpha In_{1-\alpha}P$ mixed crystal, which was formed in the same manner as in the Example 2. The second barrier layer 106 was formed at 800° C. by an atmospheric pressure $(C_2H_5)_3B/PH_3/H_2$ MOCVD method. The carrier concentration of the second barrier layer 106 was about $2\times10^{19}$ cm$^{-3}$ and the layer thickness was about 240 nm. The band gap of the boron monophosphide layer constituting the second barrier layer 106 was about 3.0 eV at room temperature. A light-emitting part having a p-n junction-type DH structure, where the light-emitting layer 104 and the "evaporation-preventing" layer 105 were sandwiched by the p-type first barrier layer 103 and the n-type second barrier layer 106, was constructed.

A back surface electrode 107 and a surface electrode 108 were formed on the back surface of the silicon single crystal substrate 101 and at the center part on the surface of the n-type second barrier layer 106, respectively. Thereafter, the Si single crystal of the substrate 101 was cut to fabricate an n side-up type square LED with a one-side length of about 350 μm and emitting light through the "evaporation-preventing" layer 105 and the second barrier layer 106 to the outside.

When an operating current of 20 mA was passed in the forward direction between the surface electrode 108 and the back surface electrode 107, the center wavelength of light emission was about 450 nm. In the LED of Example 3, the light-emitting part was constructed to have a DH junction structure and therefore, the brightness in a chip state measured using a general integrating sphere was about 10 mcd. As such, an LED having high light emission intensity was provided. By virtue of good p-n junction property, the forward voltage (=$V_f$) determined from current-voltage (I-V) characteristics was about 3 V at the forward current of 20 mA and the reverse voltage at the reverse current of 10 μA was 8 V. An LED having a high breakdown voltage was thus provided.

Effects of the Invention:

According to the present invention, the "evaporation-preventing" layer is composed of a boron phosphide (BP)-base semiconductor, so that an "evaporation-preventing" layer capable of preventing the evaporation of indium and maintaining a predetermined indium composition of the light-emitting layer can be readily formed. A p-n junction-type compound semiconductor light-emitting device capable of radiating high-intensity light corresponding to the predetermined indium composition can be also provided.

In addition, according to the present invention, the "evaporation-preventing" layer is composed of a boron phosphide-base semiconductor almost lattice-matching with the indium-containing group III nitride semiconductor constituting the light-emitting layer, so that introduction of crystal defects ascribable to lattice mismatch into the light-emitting layer can be avoided, and a p-n junction-type compound semiconductor light-emitting device of higher light emission intensity can be provided.

Furthermore, according to the present invention, a second barrier layer of a second conduction type and composed of an undoped boron phosphide-base semiconductor where an impurity is not added is provided on the "evaporation-preventing" layer, so that a light-emitting part having a DH structure acheived by sandwiching the light-emitting layer and the "evaporation-preventing" layer by the first barrier layer of a first conduction type and the second barrier layer can be provided. Such structure provides a p-n junction-type compound semiconductor light-emitting device having still higher light emission intensity.

Morevover, when a lamp or a light source is fabricated using the p-n junction-type compound semiconductor light-emitting device of the present invention, a lamp or a light source having excellent light emission intensity can be provided.

While the invention has been described in detail and with reference to specific embodiments thereof, it will be apparent to one skilled in the art that various changes and modifications can be made therein without departing from the spirit and scope thereof.

This application is based on Japanese Patent Application No. P2002-75297 filed Mar. 19, 2002, incorporated herein by reference in its entirety.

What is claimed is:

1. A p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of a first or a second conduction type, and an evaporation-preventing layer provided on the light-emitting layer for preventing the evaporation of indium from the light-emitting layer, wherein the evaporation-preventing layer is composed of an undoped boron phosphide (BP)-base semiconductor of second conduction type.

2. The p-n junction-type compound semiconductor light-emitting device as claimed in claim 1, wherein the evaporation-preventing layer almost lattice-matches with the light-emitting layer.

3. The p-n junction-type compound semiconductor light-emitting device as claimed in claim 1, wherein the first barrier layer is composed of an undoped boron phosphide-base semiconductor where an impurity is not added.

4. A p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of a first or a second conduction type, an evaporation-preventing layer provided on the light-emitting layer for preventing the evaporation of indium from the light-emitting layer, and a second barrier layer provided on the evaporation-preventing layer and composed of a compound semiconductor of a second conduction type, wherein the evaporation-preventing layer is composed of an undoped indirect transition-type boron phosphide (BP)-base semiconductor of a first or a second conduction type.

5. The p-n junction-type compound semiconductor light-emitting device as claimed in claim 4, wherein the evaporation-preventing layer almost lattice-matches with the light-emitting layer.

6. The p-n junction-type compound semiconductor light-emitting device as claimed in claim 4, wherein the first barrier layer is composed of an undoped boron phosphide-base semiconductor where an impurity is not added.

7. The p-n junction-type compound semiconductor light-emitting device as claimed in claim 4, wherein the second barrier layer is composed of an undoped boron phosphide-base semiconductor where an impurity is not added.

8. A lamp comprising a p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of first or a second conduction type, and an evaporation-preventing layer provided on the light-emitting layer for preventing the evaporation of indium from the light-emitting layer, wherein the evaporation-preventing layer is composed of an undoped boron phosphide (BP)-base semiconductor of second conduction type.

9. A light source comprising the lamp as claimed in claim 8.

10. A method for producing a p-n junction-type compound semiconductor light-emitting device, said p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of a first or a second conduction type, and an evaporation-preventing layer provided on the light-emitting layer for preventing the evaporation of indium from the light-emitting layer, wherein the evaporation-preventing layer is composed of an undoned boron phosphide (BP)-base semiconductor of second conduction type, which method comprises forming a first barrier layer composed of a compound semiconductor of a first conduction type on a substrate composed of a single crystal, forming a light-emitting layer composed of an indium (In)-containing group III nitride semiconductor of first or a second conduction type on the first barrier layer, and forming an evaporation-preventing layer on the light-emitting layer for preventing the evaporation of indium from the light-emitting layer, wherein the evaporation-preventing layer is composed of an undoped boron phosphide (BP)-base semiconductor of a second conduction type.

11. The method for producing a p-n junction-type compound semiconductor light-emitting device as claimed in claim 10, which comprises forming the first barrier layer, the light-emitting layer and the evaporation-preventing layer by a metal organic chemical vapor deposition method (MOCVD method).

12. A method for producing a p-n junction-type compound semiconductor light-emitting device, said p-n junction-type compound semiconductor light-emitting device comprising a substrate composed of a single crystal, a first barrier layer provided on the substrate and composed of a compound semiconductor of a first conduction type, a light-emitting layer provided on the first barrier layer and composed of an indium (In)-containing group III nitride semiconductor of a first or a second conduction type, an evaporation-preventing layer provided on the light-emitting layer for preventing the evaporation of indium from the light-emitting layer, and a second barrier layer provided on the evaporation-preventing layer and composed of a compound semiconductor of a second conduction type, wherein the evaporation-preventing layer is composed of an undoped indirect transition-type boron phosphide (BP)-base semiconductor of a first or a second conduction type, which method comprises forming a first barrier layer composed of a compound semiconductor of a first conduction type on a substrate composed of a single crystal, forming a light-emitting layer composed of an indium (In)-containing group III nitride semiconductor of a first or a second conduction type on the first barrier layer, forming an evaporation-preventing layer on the light-emitting layer for preventing the evaporation of indium from the light-emitting layer, and forming a second barrier layer composed of a compound semiconductor of a second conduction type on the evaporation-preventing layer, wherein the evaporation-preventing layer is composed of an undoped indirect transition-type boron phosphide (BP)-base semiconductor of a first or a second conduction type.

13. The method for producing a p-n junction-type compound semiconductor light-emitting device as claimed in claim 12, which comprises forming the first barrier layer, the light-emitting layer, the evaporation-preventing layer and the second barrier layer by a metal organic chemical vapor deposition method.

* * * * *